United States Patent [19]

Beckett

[11] Patent Number: 4,517,045
[45] Date of Patent: May 14, 1985

[54] APPARATUS FOR FORMATION OF PACKAGING MATERIAL

[76] Inventor: Donald E. Beckett, 963 Tennyson Ave., Mississauga, Ontario, Canada, L5H 2Y9

[21] Appl. No.: 489,070

[22] Filed: Jun. 13, 1983

Related U.S. Application Data

[62] Division of Ser. No. 302,370, Sep. 15, 1981, Pat. No. 4,398,994.

[51] Int. Cl.³ ............................ C23F 1/02; B44C 1/22; C03C 15/00; C03C 25/06
[52] U.S. Cl. .................................... 156/345; 156/635; 156/659.1; 156/660; 156/665
[58] Field of Search ............... 156/345, 635, 640, 656, 156/659.1, 658, 660, 661.1, 665; 252/79.5

[56] References Cited

U.S. PATENT DOCUMENTS 2,099,697 11/1937 Marshall .............................. 156/660
3,647,508 3/1972 Gorrell ........................... 156/635 X
4,242,378 12/1980 Arai ............................ 156/659.1 X Primary Examiner—William A. Powell
Attorney, Agent, or Firm—Sim & McBurney

[57] ABSTRACT

A pattern is formed in rapid and continuous manner on aluminized polymer film by printing the aluminum surface with a sodium hydroxide-resistant material, which may be pigmented, contacting the non-overprinted areas of the aluminum with hot aqueous sodium hydroxide solution to dissolve the aluminum rapidly from the base polymeric film and leave unaffected the overprinted areas, and washing the spent sodium hydroxide solution from the film. The steps are carried on a continuous web of aluminized film and result in pattern of opaque areas and transparent areas, corresponding to the overprinted and non-overprinted areas of the film.

5 Claims, 1 Drawing Figure

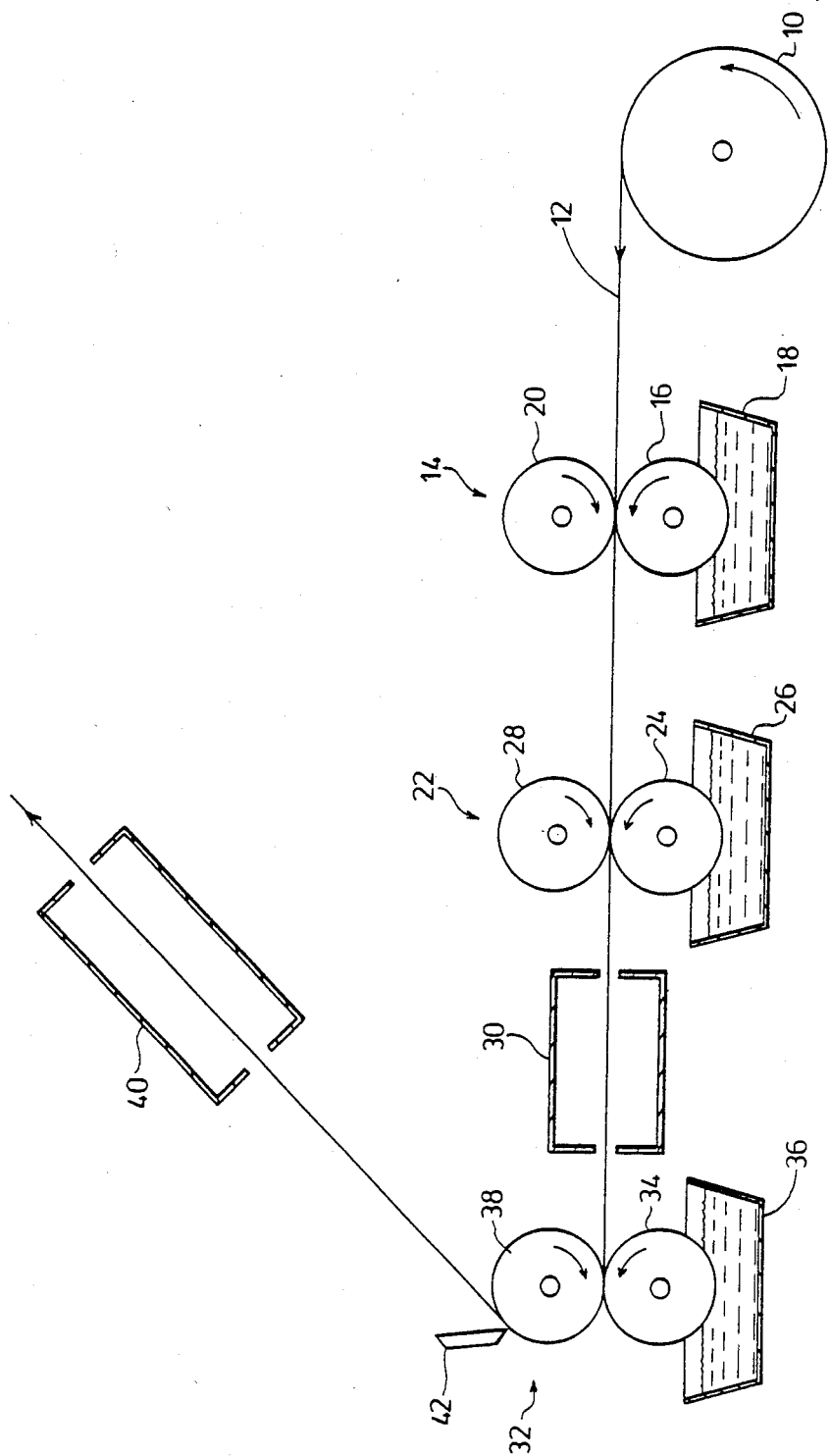

APPARATUS FOR FORMATION OF PACKAGING MATERIAL

REFERENCE TO RELATED APPLICATION

This application is a division of U.S. Ser. No. 302,370 filed Sept. 15, 1981 (now U.S. Pat. No. 4,398,994).

FIELD OF INVENTION

The present invention relates to packaging material, in particular metallized plastic film.

BACKGROUND TO THE INVENTION

Metallized plastic film material is used for a wide variety of packaging operations. The film is made by vapor depositing a layer of the metal, usually aluminum, on the polymeric substrate, and it has previously been suggested to mask portions of the polymer substrate to prevent metal vapor deposition thereon and thereby provide a transparent area or window through which product packaged in a package formed from the film may be viewed. The major problem with the provision of such windows is lack of color compatibility for colors which are printed both on the window area and the metallized area. Further, patterns more intricate other than simple windows have not been produced on metallized plastic film by this masking method.

It has previously been suggested in U.S. Pat. No. 4,242,378 to provide a pattern of see-through portions and opaque portions on a metallized plastic film by forming a pattern of a water-insoluble resin on the metal layers corresponding to the opaque portions and immersing the resulting film in an aqueous solution of a metal solubilizer to dissolve the exposed metal while leaving untouched the patterned portion to form the see-through portion in the dissolved metal areas. Although this process is capable of producing colored printing by using resin-based printing inks, the procedure is time consuming and incapable of rapid continuous operation.

SUMMARY OF INVENTION

In accordance with the present invention, there is provided a method of printing on a metallized polymer film, which comprises applying pattern of etchant-resistant material to the metal surface of the polymer film, contacting acid metal surface with a etchant solution to dissolve the metal from the film, and washing the surface free of etchant solution.

The method of the invention is effected under critical etchant conditions to achieve rapid and continuous operation. The etching step is effected using sodium hydroxide solution which may have a NaOH concentration of up to 25% by weight, preferably in the range of about 5 to about 10% by weight.

The time required for application of the sodium hydroxide solution to the printed film to etch the exposed metal surface from the polymer film depends to some extent on the temperature of the sodium hydroxide solution. Temeratures in the range of about 15 to about 100 C. may be used with treatment times varying in temperature dependant manner in the range of about 10 seconds to about 0.1 second. For continuous operation, it is preferred to maintain the contact time quite short, and hence it is preferred to use a temperature of above about 50 C.

The procedure is effected continuously by drawing a web of metallized plastic film from a source roll and conveying the web successively past a printing station, an etchant application station and a washing station, before being dried and reeled onto a take-up roll. The web speed may be varied widely up to about 1000 ft/min, preferably in the range of from about 100 to about 700 ft/min.

BRIEF DESCRIPTION OF DRAWING

The sole FIGURE of the drawing is a schematic representation of an apparatus for effecting the present invention.

DESCRIPTION OF PREFERRED EMBODIMENT

Referring to the drawing, a continuous web 12 of metallized polymer film is drawn from a roll 10. Any desired polymeric material may be used as the base film, including polyethylene, polypropylene, polystyrene, polyester, polyvinyl chloride and polycarbonate. The base film may be any desired thickness sufficient to enable a suitable packaging material to be formed therefrom, preferably about 10 to about 50 microns.

The metal layer, which is provided on one face of the polymeric film, is obtained by vacuum coating in well known manner. The thickness of the metal film may vary widely within the range from 10 about to about 1000 A, preferably about 300 to 600 A. Aluminum is usually the metal.

The continuous web 12, in which the metal film faces downwardly as seen in the FIGURE is conveyed past a printing station 14 whereat a pattern of etchant-resistant material is printed on the metal layer from a printing roller 16. The etchant-resistant material may be a water-insoluble resinous material and may be pigmented or clear, in accordance with the appearance of the pattern desired on the metal layer.

Etchant-resistant material is applied to a pattern provided on the surface of roller 16 by pick up from a bath 18 of etchant-resitant material. The roller 16 is backed by a backing roller 20. The web 12 leaving the printing station 14 bears a predetermined pattern of etchant-resistant material overlying the metal layer, with areas of exposed metal layer between the portions of etchant-resistant material overlying the metal layer.

The patterned web is next conveyed past an etchant-applying station 22 whereat sodium hydroxide solution is applied to the patterned web across the whole width thereof from a wet roller 24. The wet roller 24 usually is heated to an elevated temperature, preferably in the range of about 50 to about 90 C., so that the aqueous sodium hydroxide solution is applied by the wet roll 24 hot to the web 12 engaged by the roll 24. A backup roller 28 is provided to assist in application of sodium hydroxide solution.

The sodium hydroxide solution of desired concentration, preferably about 5 to about 10% by weight, is provided on the surface of the roller 24 by pick up from a bath 26 of sodium hydroxide solution.

Application of the hot sodium hydroxide solution across the width of the web 12 commences etching of the aluminum layer from the base film in those areas where the aluminum is exposed to the solution. The etchant-resistant printed areas are not affected by the sodium hydroxide solution and hence the aluminum located under the etchant-resistant material remains in contact with the base film.

The dissolving of the exposed aluminum in the sodium hydroxide solution occurs as the web 12 travels along its horizontal path beyond the etchant-applying station 22 and is complete rapidly. In order to require only a minimum of floor space, the travel path of the etchant-applied web beyond the station 22 is maintained quite short by balancing the factors of web speed and etchant temperature and concentration.

In addition, the web 12 may pass through an air tunnel 30, through which heated air may flow, to assist in the rapid completion of the etching procedure.

Upon completion of the etching, the web 12 is washed at washing station 32. Water is applied to the web 12 by a squeegee-type roller 34 which dips into a bath 36 of water. The spent wash water flows back into the bath 36. As a wash water is applied, the web 12 passes round a takeup roller 38. The washed web may be dried by a hot air drier 40, if desired with the assistants of an air doctor 42 before passage to a take-up roll (not shown).

The washed and dried web comprises an opaque pattern corresponding to the pattern printed thereon at the printing station 14 and transparent areas between the opaque pattern comprising base film from which the aluminum has been removed. The procedure produces in rapid continuous manner a patterned polymeric film suitable for use as a packaging material.

Since the film is printed with the desired pattern, which may be simple or intricate, or may be transparent or pigmented, the prior art problems of color matching and the inability to produce intricate patterns when the masking technique is used are overcome. Further, the procedure of the invention is rapid and continuous, and thereby overcomes the problems of U.S. Pat. No. 4,242,378.

EXAMPLE

Aqueous sodium hydroxide solution at concentration of 5 wt% NaOH and 10 wt% NaOH was applied to aluminized Mylar (trade mark) film at various temperatures and the period of time for complete removal of the aluminum from the film was determined.

The results obtained are set forth in the following Table:

TABLE

| Temperature C. | NaOH Solution | |
| --- | --- | --- |
| | 5 wt % | 10 wt % |
| | (secs) | |
| 50 | 5.5 | 3.8 |
| 60 | 3.5 | 2.1 |
| 70 | 2.2 | 1.3 |
| 80 | 1.5 | 1 |
| 90 | 1 | 0.5 |

The very rapid removal of the aluminum from the foil, demonstrated by the results of the Table, indicates that continuous high speed production of patterned film can be attained using elevated temperatures and moderate sodium hydroxide concentrations.

SUMMARY OF DISCLOSURE

In summary of this disclosure, the present invention provides a improved method of patterning aluminized polymeric film which is superior to prior procedures. Modifications are possible within the scope of the invention.

What I claim is:

1. Apparatus for forming a repetitive pattern on a roll of aluminized polymer film, comprising
   holder means for holding said roll of aluminized polymer film so that a web may be drawn therefrom;
   printing station means for printing a desired pattern on said web, said printing station means including a rotary patterned printing surface for engagement with the aluminized surface of said web and etchant-resistant material application means for applying etchant-resistant material to said pattern on said printing surface;
   etchant material-applying station means located spaced from said printing station means in a direction downstream of the intended direction of motion of said web, said etchant-material applying station means including a rotary surface for engagement with the patterned surface of said web and etchant-material application means for applying a film of sodium hydroxide solution to said rotary surface;
   washing station means located spaced from said etchant material-applying station means in a direction downstream of the intended direction of motion of said web, said washing station means including wash water applying and removal means for application of wash water to the etchant-applied surface of the web to wash spent sodium hydroxide therefrom and removal of the resulting spent wash water therefrom
   drying means for drying said washed web; and
   take up means for taking up a roll of the dried web of patterned film.

2. The apparatus of claim 1 wherein said rotary surface of said etchant material-applying means is heated, whereby said film of sodium hydroxide solution is applied hot to said patterned surface.

3. The apparatus of claim 1 including air flow chamber means located between said etchant material-applying station means and said washing station means.

4. The apparatus of claim 1 wherein siad drying means comprises a hot air drying chamber means spaced from said washing station means in a direction downstream of the intended direction of motion of said web.

5. The apparatus of claim 1, 2, 3 or 4 wherein said printing station means, etchant material-applying station means, and washing station means are in substantially horizontal aligment, whereby said web passes substantially horizontally between said stations.

* * * * *